(12) United States Patent
Handschy et al.

(10) Patent No.: US 7,733,557 B2
(45) Date of Patent: Jun. 8, 2010

(54) SPATIAL LIGHT MODULATORS WITH CHANGEABLE PHASE MASKS FOR USE IN HOLOGRAPHIC DATA STORAGE

(75) Inventors: Mark A. Handschy, Boulder, CO (US); Michael J. O'Callaghan, Louisville, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/739,642

(22) Filed: Apr. 24, 2007

(65) Prior Publication Data

US 2007/0247687 A1  Oct. 25, 2007

Related U.S. Application Data

(60) Provisional application No. 60/883,492, filed on Jan. 4, 2007, provisional application No. 60/745,505, filed on Apr. 24, 2006.

(51) Int. Cl.
*G02F 1/01* (2006.01)
*G02B 5/32* (2006.01)
*G03H 1/16* (2006.01)
*G11B 7/00* (2006.01)

(52) U.S. Cl. .............. 359/279; 359/245; 359/320; 359/237; 359/561; 359/11; 359/15; 359/29; 359/35; 369/103; 349/74; 349/171; 345/690

(58) Field of Classification Search ............ 359/3, 359/7, 9, 11, 15, 21, 28, 29, 35, 290, 291, 359/298, 279, 630, 1, 14, 245, 254, 315, 359/318, 316, 320, 368, 370, 386, 388; 355/53, 355/55; 385/15–18, 37, 39; 345/84, 89, 345/690; 349/33, 38, 39, 49, 74, 117, 139, 349/141, 143, 147, 201, 77, 163, 171, 191, 349/202; 369/103, 44.11; 250/459.1; 356/300, 356/310, 512, 521, 601; 382/278, 280
See application file for complete search history.

(56) References Cited

U.S. PATENT DOCUMENTS 3,834,787 A * 9/1974 Oshida ............... 359/21
(Continued)

FOREIGN PATENT DOCUMENTS

EP  0450644 A2  4/1991

(Continued)

OTHER PUBLICATIONS

Hong, John, et al., "Influence of phase masks on cross talk in holographic memory," Optics Letters, vol. 21, No. 20, Oct. 15, 1996, pp. 1694-1696.

(Continued)

*Primary Examiner*—Loha Ben
(74) *Attorney, Agent, or Firm*—Robert G. Crouch; Marsh Fischmann & Breyfogle LLP

(57) ABSTRACT

A holographic data storage system that includes a write head that includes a pixellated spatial light modulator and a separate or integral phase mask that varies the phase depending on the location in the phase mask that light passes through. The phase variation can be changed over time in a random, pseudo-random, or predetermined fashion. The spatial light modulator and phase mask can be implemented in a liquid crystal SLM (nematic, ferroelectric, or other), in a DMD SLM, in a magneto-optical SLM, or in any other suitable manner.

21 Claims, 12 Drawing Sheets

U.S. PATENT DOCUMENTS

| | | | |
|---|---|---|---|
| 3,946,370 A * | 3/1976 | Schmidt et al. | 365/125 |
| 3,946,379 A | 3/1976 | Lippman | |
| 4,084,880 A * | 4/1978 | Clow | 359/15 |
| 4,104,489 A * | 8/1978 | Satoh et al. | 369/103 |
| 4,952,010 A * | 8/1990 | Healey et al. | 359/11 |
| 5,182,665 A | 1/1993 | O'Callaghan et al. | |
| 5,212,583 A * | 5/1993 | Vali et al. | 359/245 |
| 5,312,513 A | 5/1994 | Florence et al. | |
| 5,477,354 A * | 12/1995 | Schehrer | 349/74 |
| 5,552,916 A | 9/1996 | O'Callaghan et al. | |
| 5,748,164 A | 5/1998 | Handschy et al. | |
| 5,759,721 A | 6/1998 | Dhal et al. | |
| 5,784,141 A * | 7/1998 | Chen et al. | 349/191 |
| 5,801,800 A * | 9/1998 | Wright et al. | 349/77 |
| 5,808,800 A | 9/1998 | Handschy et al. | |
| 5,812,288 A | 9/1998 | Curtis et al. | |
| 5,914,802 A | 6/1999 | Stappaerts et al. | |
| 5,995,251 A | 11/1999 | Hesselink et al. | |
| 6,031,643 A * | 2/2000 | Burr | 359/28 |
| 6,088,321 A * | 7/2000 | Yamaji et al. | 369/103 |
| 6,103,454 A | 8/2000 | Dhar et al. | |
| 6,221,536 B1 | 4/2001 | Dhar et al. | |
| 6,281,993 B1 * | 8/2001 | Bernal et al. | 359/29 |
| 6,303,270 B1 | 10/2001 | Flaim et al. | |
| 6,456,419 B1 * | 9/2002 | Winker et al. | 359/279 |
| 6,486,939 B2 * | 11/2002 | Lin | 355/53 |
| 6,674,555 B1 * | 1/2004 | Curtis et al. | 359/29 |
| 7,064,883 B2 | 6/2006 | Payne et al. | |
| 7,327,470 B2 * | 2/2008 | Arieli et al. | 356/512 |
| 7,400,436 B2 * | 7/2008 | Hendriks | 359/279 |
| 7,411,708 B2 * | 8/2008 | Waldman et al. | 359/29 |
| 2005/0207313 A1 * | 9/2005 | Handschy et al. | 369/103 |

FOREIGN PATENT DOCUMENTS

| | | |
|---|---|---|
| EP | 045-744 A2 | 10/1991 |
| EP | 0856767 A2 | 8/1998 |

OTHER PUBLICATIONS

Iwamoto, Akito, "Artificial diffuser for Fourier transform hologram recording," Applied Optics, vol. 19, No. 2, Jan. 15, 1980, pp. 215-221.

Brauer, Ralf, et al., "Diffusers in digital holography" J. Opt. Society of America, vol. 8, No. 3, Mar. 1991, pp. 572-578.

Dixit, S. N., et al., "Random phase plates for beam smoothing on the Nova laser," Applied Optics, vol. 32, No. 14, May 10, 1993, pp. 2543-2554.

Esaev, D. G., et al., "Continuous random phase mask," Sov. Phys. Tech. Phys. 22(9), Sep. 1977, pp. 1150-1152.

Gao, Qiang, et al., "Improvement to holographic digital data-storage systems with random and pseudorandom phase masks," Applied Optics, vol. 36. No. 20, Jul. 10, 1997, pp. 4853-4861.

Nakayama, Yoshikazu, et al., "Image quality in holography with a pseudorandom diffuser," Applied Optics, vol. 20, No. 13, Jul. 1, 1981, pp. 2178-2179.

Nakayama, Yoshikazu, et al., "Linear recording of Fourier transform holograms using a pseudorandom diffuser," Applied Optics, vol. 21, No. 8, Apr. 15, 1982, pp. 1410-1418.

Wang, Xu-Ming, et al., "Optical associative memory with bipolar edge-enhanced learning that uses a binary spatial light modulator and a BaTiO3 crystal," Applied Optics, vol. 34, No. 32, Nov. 10, 1995, pp. 7565-7572.

Armitage, David, et al., "Liquid-Crystal integrated silicon spatial light modulator" Applied Optics, vol. 31, No. 20, Jul. 10, 1992, pp. 3945-3949.

Domjan, Laszlo, et al., "Ternary phase-amplitude modulation with twisted nematic liquid crystal displays for Fourier-plane light homogenization in holographic data storage," Optik International Journal for Light and Electron Optics, 113, No. 9, 2002, pp. 382-390.

Domjan, Laszlo, "Generation of Spatial Light Distributions," PhD dissertation, Department of Atomic Physics, Faculty of Natural Sciences TU Budapest, 2004.

Jang, Ju-Seog, et al., " Optical representation of binary data based on both intensity and phase modulation with a twisted-nematic liquid-crystal display for holographic digital data storage," Optics Letters, vol. 26, No. 22, Nov. 15, 2001, pp. 1797-1799.

Kast, Brian A., et al., "Implementation of Ternary phase amplitude filters using a magnetoopitc spatial light modulator" Applied Optics, vol. 28, No. 6, Mar. 15, 1989.

Li, Kebin, et al., "Coherent micromirror arrays," Optics Letters, vol. 27, No. 5, Mar. 1, 2002, pp. 366-368.

Remenyi, Judit, et al., "Amplitude, phase, and hybrid ternary modulation modes of a twisted-nematic liquid-crystal display at 400 nm," Applied Optics, vol. 42, No. 17, Jun. 10, 2003, pp. 3428-3434.

John, Renu, et al., "A new balanced modulation code for a phase-image-based holographic data storage system," Journal of Opitcs A: Pure and Applied Optics, vol. 7, 2005, pp. 391-395.

John, Renu, et al., "Content-addressable Holographic Digital Data Storage Based on Hybrid Ternary Modulation with a Twisted-Nematic Liquid-Crystal Spatial Light Modulator," Optical Review, vol. 12, No. 3 (2005) pp. 155-160.

Senturia, Stephen D., "Programmable diffraction gratings and their uses in displays, spectroscopy, and communications," J. Microlith., Microfab, Microsystem 4(4), Oct.-Dec. 2005, pp. 041401-1-6.

De Bougrenet De La Tocnaye, J.L., et al., "Complex amploitude modulation by use of liquid-crystal spatial light modulators," Applied Optics, vol. 36, No. 8, Mar. 1997, pp. 1730-1741.

Cohn, Robert W., "Fundamental properties of spatial light modulators for the approximate optical computation of Fourier transforms: a review," Opt. Eng., 40(11) Nov. 2001, pp. 2452-2463.

Davis, Jeffrey A., et al., "Encoding amplitude information onto phase-only filters," Applied Optics, vol. 38, No. 23, Aug. 10, 1999, pp. 5004-5013.

D'Have, K, et al., "Antiferroelectric liquid crystals with 45 degree tilt: new electro-optic effects in liquid crystals," Invited Paper, In Liquid Crystal Materials, Devices, and Flat Panel Displays, Ranganathan Shashidhar, Bruce Gnade, Editors, Proceedings of SPIE vol. 3955 (2000), pp. 33-44.

D'Have, Koen, "Application of antiferroelectric Liquid Crystals with High Tilt," Universiteit Gent, Academiejaar: 2001-2202 Vakgroep Elektronica en Informatiesystemen.

Kaura, Mary A., et al., "Optical correlator performance using a phase-with-constrained-magnitude complex spatial filter," Applied Opitcs, vol. 29, No. 17, Jun. 10, 1990, pp. 2587-2593.

Kato, Makoto, et al., "Speckle Reduction in Holography with a Spatially Incoherent Source," Applied Optics, May 1975, vol. 14, No. 5, pp. 1093-1099.

Handschy, Mark, "Semiconductor Manufacturing Techniques for Ferroelectric Liquid Crystal Microdisplays" Solid State Technology, vol. 43, May 2000, pp. 151-161.

Bernal, Maria-P., et al., "Experimental Study of the Effects of a Six-Level Phase Mask on a Digital Holographic Storage System," Applied Optics, vol. 37, No. 11, Apr. 10, 1998, pp. 2094-2101.

Ashley, J. et. al., "Holographic Data Storage," IBM J. Res. Develop, vol. 44 No. 3, May 2000, pp. 341-368.

O'Callaghan, Michael J., "Switching Dynamics and Surface Forces in thresholdless "V-shaped" switching ferroelectric Liquid Crystals," Physical Review E 67, 011710 (2003.

* cited by examiner

SPATIAL LIGHT MODULATORS WITH CHANGEABLE PHASE MASKS FOR USE IN HOLOGRAPHIC DATA STORAGE

CROSS-REFERENCE TO RELATED APPLICATIONS

This application claims priority from U.S. Provisional Patent Application Nos. 60/745,505 filed Apr. 24, 2006, entitled "Spatial Light Modulators with Integrated Phase Masks that can be Changed with Time," and 60/883,492 filed Jan. 4, 2007, entitled "Digital Display," the contents of each of which are incorporated herein by reference.

BACKGROUND

Holographic optical data storage is an attractive alternative to magnetic tape, magnetic disc, and optical disc storage of digital computer data. It offers high capacity and high recording and reading data rates on storage media that can be removed from the drive, as described in *Holographic Data Storage*, H. J. Coufal, D. Psaltis, G. T. Sincerbox, editors, (Springer-Verlag, Berlin, 2000), incorporated herein by reference. Data to be stored is written to a photosensitive storage media by overlapping an information-bearing light beam (the signal beam) with a reference light beam. When the beams are coherent, coming for example from the same laser, standing waves in the beam's interference pattern create changes in the photosensitive material's index of refraction, thus forming a hologram. The stored data can be read out by illuminating the recorded hologram with the reference beam alone: the hologram diffracts light from the reference beam to create a copy of the original information-bearing beam. Multiple holograms can be recorded within the same volume of storage media by, for example, varying the angle of the reference beam. This is known as angular multiplexing. Many other hologram-multiplexing techniques are known in the art. The use of volumetric storage enables extremely high capacities, and the parallelism inherent in page-oriented storage offers much higher data rates that conventional serial bit-at-a-time technologies.

The information to be recorded or stored is imposed on the light beam through the use of a spatial light modulator (SLM). The SLM converts input electronic data to a two-dimensional image of bright and dark pixels, for example. Light modulated by the SLM passes through the optical system of the HDS device or drive to be recorded within the storage medium. In some instances, the SLM may modulate the phase (rather than the intensity or amplitude) of the light. Typically, a lens between the SLM and the recording medium is used to form a spatial Fourier transform of the SLM image in the region where the hologram is to be recorded in the photosensitive material of the storage medium. Subsequently, when it is desired to read the data stored in the medium, the hologram stored in the recording medium is illuminated by the reference beam to reconstruct the SLM image, which can then be detected by a photodetector such as a CCD camera. One example of an is SLM suitable for holographic data storage systems can be made using ferroelectric liquid crystals (FLCs) atop a CMOS backplane, constructed similarly to the microdisplay devices described in U.S. Pat. Nos. 5,748,164 and 5,808,800, the contents of which are incorporated herein by reference. These SLMs can be fabricated by techniques that are well known in the art, for example as described in "Semiconductor manufacturing techniques for ferroelectric liquid crystal microdisplays," by Mark Handschy in Solid State Technology volume 43, pages 151-161 (2000), incorporated herein by reference.

However, several difficulties in the implementation of a practical holographic data storage system can be traced to the design and performance of the signal-beam optical path. Also, the particular FLC SLM devices described in the above-mentioned patents do not make ideal write-heads. For example, when the SLM is operated as an intensity modulator, its Fourier transform contains a bright central spot, the DC spot, that is as much as 60 dB (one million times) brighter than the surrounding light intensity. This bright spot can saturate the optical recording medium, making it difficult to record and reconstruct data with high fidelity.

It is known in the art that the Fourier-plane DC bright-spot problem can be solved by introducing into the optical system a phase mask that imposes fixed, pseudo-random optical phase variations across the wave front, as is disclosed in U.S. patent application Ser. No. 11/046,197, "Phase Masks for Use in Holographic Data Storage," incorporated herein by reference. That patent application disclosed the fabrication of phase masks by a variety of techniques including relief structures in either the window or mirrors of a liquid crystal on silicon (LCOS) SLM. Also disclosed there was the implementation of an integral phase mask by use of three or more electrically selected states of the liquid crystal modulators in a liquid-crystal-on-silicon (LCOS) SLM.

The foregoing examples of the related art and limitations related therewith are intended to be illustrative and not exclusive. Other limitations of the related art will become apparent to those of skill in the art upon a reading of the specification and a study of the drawings.

SUMMARY

SLMs are described herein with integrated phase masks wherein the phase spatial pattern of the phase mask may be changed in time. This has particular benefits for the use of such SLMs as the input device in an HDS system, where varying the SLM phase pattern reduces the build up in the HDS recording media of the otherwise stationary pattern of sharp intensity peaks produced by the SLM. Thus, a more even exposure of the recording media is produced, which reduces the demand on media dynamic range, and permits recording a greater number of holograms per unit media volume, and hence storage of data at a greater density.

The following embodiments and aspects thereof are described and illustrated in conjunction with systems, tools, and methods which are meant to be exemplary and illustrative, and not limiting in scope. In various embodiments, one or more of the above-described problems have been reduced or eliminated, while other embodiments are directed to other improvements.

A write head for a holographic data storage system includes a spatial light modulator that is arranged into an array of pixels that can each separately modulate light that is directed toward the spatial light modulator; and a phase mask that is capable of varying the phase of light passing therethrough, the phase variation being dependent on the particular portion of the phase mask that the light passes through. The phase variation of at least a portion of the phase mask can be changed over time.

The pixels of the spatial light modulator may be switched into one of at least three different optical states. The spatial light modulator may be a liquid crystal spatial light modulator. The spatial light modulator may be a ferroelectric liquid crystal spatial light modulator. The spatial light modulator may include a layer of liquid crystal material sandwiched between two substantially planar surfaces.

The spatial light modulator may include micromechanical mirrors that can be moved over time. Each of the micromechanical mirrors may be tilted to at least one of two different positions to turn the pixel associated with that mirror ON or OFF and each of the micromechanical mirrors are moved in a direction substantially parallel to the incoming light to at least one of two different positions to change the phase of the pixel associated with that mirror.

Each pixel in the array of pixels of the spatial light modulator may include a pixel electrode and each pixel electrode includes at least two segments, wherein the two segments can be driven to different voltage levels relative to each other. The two segments may include interleaved portions that can create a diffraction grating.

The phase variation may be changed in a random or pseudo-random fashion. The phase variation may be changed in a predetermined fashion. The pixels of the spatial light modulator may have an amplitude optical state determined by data supplied thereto, wherein the predetermined fashion is determined in accordance with the supplied data. The amplitude optical state may include at least two different amplitude optical states, wherein for one of the two different amplitude optical states, the phase variation is of a first amount for a given pixel, and for the next subsequent pixel that is in that same amplitude optical state, the phase variation is of a second amount, with the phase variation continuing to alternate between the first and second amounts for subsequent pixels.

The array of pixels in the spatial light modulator may have a pixel pitch of less than 6 um. The phase variation may be determined by a phase mask generator that is located in a silicon backplane with the spatial light modulator.

In another aspect, a write head for a holographic data storage system includes a spatial light modulator that is arranged into an array of pixels that can each separately modulate light that is directed toward the spatial light modulator and that can vary the phase of light passing therethrough, the phase variation being dependent on the pixel that the light passes through. The phase variation of at least a portion of the pixels can be changed over time.

In another aspect, a write head for a holographic data storage system includes a spatial light modulator having an array of pixels, each of the pixels in the array being independently switchable between a high optical throughput state and a low optical throughput state in response to data supplied thereto, each of the pixels in the high optical throughput state further being switchable between a first optical phase state and a second optical phase state in a predetermined fashion in accordance with the supplied data.

Each pixel may include a switchable diffractive structure switchable between a first state of greater diffraction and a second state of lesser diffraction. The high optical throughput state may correspond to the second state of lesser diffraction while the low optical throughput state corresponds to the first state of greater diffraction.

In addition to the exemplary aspects and embodiments described above, further aspects and embodiments will become apparent by reference to the drawings and by study of the following descriptions.

DRAWING DESCRIPTIONS

DETAILED DESCRIPTION

Reference will now be made to the accompanying drawings, which assist in is illustrating the various pertinent features of the present invention. Although the present invention will now be described primarily in conjunction with holographic data storage applications, it should be expressly understood that the present invention may be applicable to other applications where altering an image with a phase mask is required/desired. In this regard, the following description of an improved holographic data storage system is presented for purposes of illustration and description. Furthermore, the description is not intended to limit the invention to the form disclosed herein. Consequently, variations and modifications commensurate with the following teachings, and skill and knowledge of the relevant art, are within the scope of the present invention. The embodiments described herein are further intended to explain modes known of practicing the invention and to enable others skilled in the art to utilize the invention in such, or other embodiments and with various modifications required by the particular application(s) or use(s) of the present invention.

Figure 1:
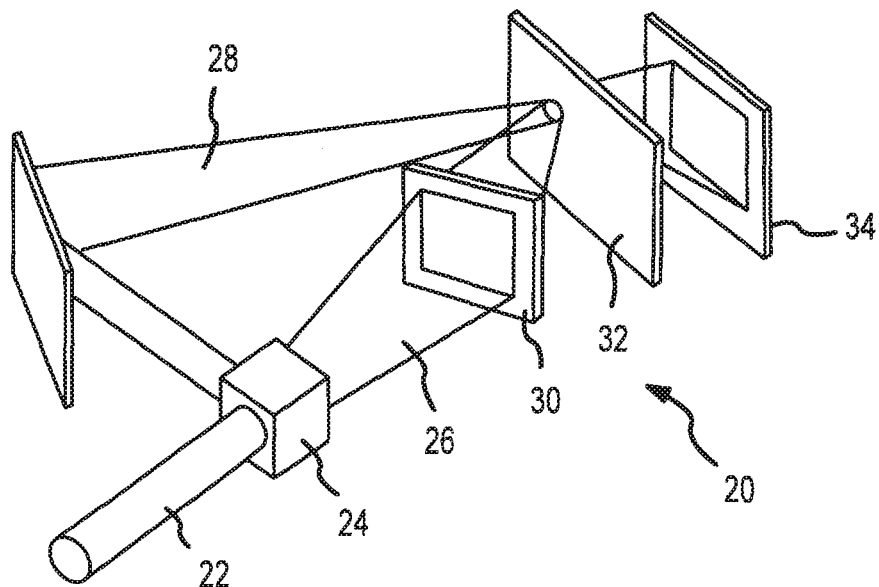
FIG. 1 is a perspective view of a holographic data storage system.

FIG. 1 shows the optical arrangement of a holographic data storage system 20 according to the present invention. As can be seen, a beam 22 from a coherent light source, such as a laser, is split by a beam splitter 24 into two beams, a signal beam 26 and a reference beam 28. The signal beam 26 is directed toward a spatial light modulator 30, such as a ferroelectric liquid crystal modulator as exemplified by those produced by Displaytech, Inc. of Longmont, Colo. Alternatively, the spatial light modulator (SLM) could be any other suitable type of SLM whether ferroelectric liquid crystal or other type of liquid crystals, such as nematic liquid crystal, or a MEMS (MicroElectroMechanical System) device such as a digital micromirror device (DMD) such as those produced by Texas Instruments under the trademark DLP or those produced by Silicon Light Machines (now a subsidiary of Cypress Semiconductor) under the name Grating Light Valve, or other MEMS device, or any other suitable SLM such as a semiconductor multiple quantum well (MQW) SLM or a magneto-optic SLM such as those formerly produced by Litton.

One of the reference beam 28 and the signal beam 26 (in this case the reference beam) is directed off-axis where it is then re-directed toward an optical storage medium 32, that may be composed of any suitable photosensitive material (such as a photorefractive crystal or a photopolymer like those available from InPhase Technologies, Inc. in Longmont, Colo. or from Aprilis, Inc. in Cambridge, Mass.). The light from the signal beam 26 is modulated by the SLM 30 (operating in transmission or reflection) and directed to the same point in the storage medium 32 as well. After modulation by the SLM, the signal beam 26 inteferes with the reference beam 28 within the optical storage medium 32 to form a three-dimensional hologram, representative of all the data displayed by the SLM 30. This is the process that is followed to write data to the storage medium 32 with the holographic data storage system 20. The stored hologram may be representative of an image or of a page of data. As can be appreciated with an SLM having an array of 1000 by 1000 pixels, 1,000,000 bits of data can be stored in each hologram.

In order to read data from the storage medium 32 with the holographic data storage system 20, the signal beam 26 and spatial light modulator 30 are not needed and the reference beam 28 alone illuminates the hologram. A detector 34, which may be in the form of a detector array, may be located on the opposite side of the storage medium 32 to read the image that is produced when the hologram is illuminated by the reference beam 28. In this manner, the image can be read back to either display the image or to read the data bits stored in that page of data. As can be appreciated, data can be read back much faster than in one-bit-at-a-time optical storage systems like CD-ROM drives.

In one form of holographic data storage system, the detector is an array of intensity-detecting pixels such as a CCD camera sensor. In this case, the image reconstructed by illuminating the hologram with the reference beam alone should be an image having intensity varying in accordance with the recorded data values. Such an intensity image is produced if the SLM used to record the hologram produced intensity modulation of the signal beam in accordance with the input data to be recorded. For example, a hologram readable by an intensity detector would be produced by an SLM that produced a bright or ON pixel when a data value of 1 was input to that pixel and produced a dim or OFF pixel in response to a 0 being input. This is in contrast to recording a pure phase or phase-only hologram. Such holograms do not suffer from the DC hot spot problem, but detecting the reconstructed image is more complicated.

Figure 2:
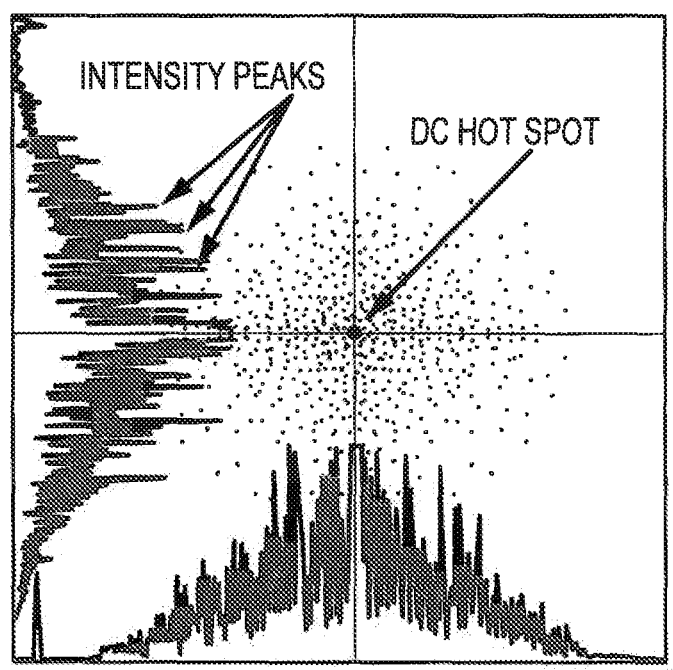
FIG. 2 shows the Fourier plane of an SLM with a fixed binary phase mask, along with intensity profiles taken horizontally and vertically through the center spot.

A single exposure with laser light in the recording media of an HDS system, which media typically encompasses or is near to the Fourier plan of the input SLM, generally produces an intensity pattern having sharp intensity peaks similar to the well-known laser phenomenon of speckle. Such a pattern, produced by exposing an LCOS SLM, fabricated at taught in the '197 patent application with a phase-mask integrated into its window, and recorded in its Fourier plane, is shown in FIG. 2, where the "fuzzy" white pattern shows the speckle-like intensity pattern. The intensity profiles shown adjacent to the bottom and left edge of the figure are taken along the cursor lines which pass through the DC hot spot, which arises because the desired π-value for the phase depth of a binary phase mask was not achieved in this particular SLM. In addition to the DC hot spot, there are large peaks (three of which are pointed out) in the intensity pattern of the light scattered away from the DC position by the phase mask.

Although it is typical in HDS data recording to multiplex multiple holograms into a single volume of media by slight shifts, for example, in the angle of the reference beam is ("angle multiplexing") or in the position of the SLM relative to the media ("shift multiplexing"), the characteristic pattern of intensity peaks produced by the particular phase-mask pattern of an SLM as disclosed in the '197 patent application may not be changed so much from one multiplex exposure to the next to prevent a given peak on one exposure from overlapping with that same peak on a subsequent exposure.

This phenomenon results in the recording media in some spots being more heavily exposed than in other spots, which in turn limits the number of exposures that can be recorded in a given volume of media. By changing the phase pattern on the SLM from exposure to exposure or from time to time, the pattern of intensity peaks in the recording plane can also be varied. Then the exposure of the media tends to average to a more uniform value, and the limits on exposure number and data density otherwise encountered can be avoided.

Thus, it may be desirable to have an SLM that can produce intensity or amplitude modulation, to enable detection by a common intensity sensor array. It may further be desirable that the SLM provide a varying optical phase in the form of a phase mask, in or close to the plane of the pixels, to spread out or diffuse the optical energy that would otherwise make a DC hot spot. Finally, it may be desirable that the SLM enable the phase mask pattern to be selectably changed from exposure to exposure and in response to the input data pattern, to avoid coherent build up of bright spots in the recording media that would unnecessarily reduce media data capacity, while still providing the high-contrast intensity modulation needed for detection of the replayed input data. SLMs that could provide the needed multi-state phase-plus-amplitude modulation are described in the '197 patent application and in prior art.

Figure 3:
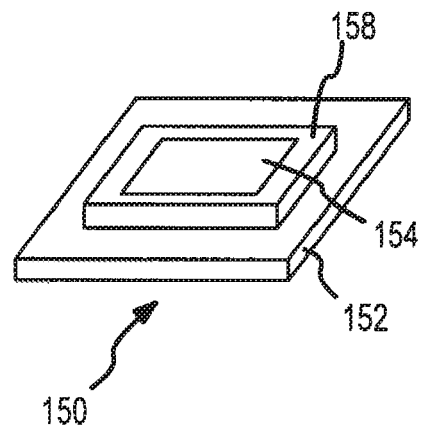
FIG. 3 is a perspective view of an SLM including a phase mask.
Figure 4:
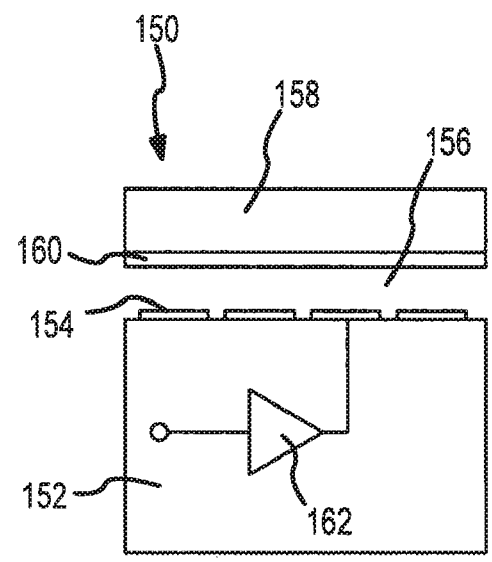
FIG. 4 is a schematic side view of portions of the SLM of FIG. 3, showing a 3-state driver for the pixel electrodes.
Figure 5:
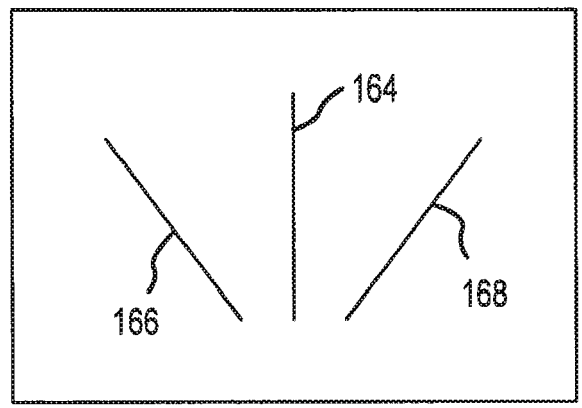
FIG. 5 is a view of the three optical states possible from the SLM of FIG. 3.

FIGS. 3-5 show an SLM 150 as disclosed in the '197 patent application. As shown is in FIG. 3 and FIG. 4, the SLM 150 includes a silicon chip 152 with an array of pixel mirrors/electrodes 154 defined thereon. A layer of FLC material 156 is sandwiched between the silicon chip 152 and a glass window 158, which may have an ITO transparent conductor layer 160 and an alignment layer (not shown). Another alignment layer (not shown) may be placed on top of the pixel mirrors/electrodes 154. A 3-state driver 162 for one of the pixel mirrors/electrodes 154 is shown in the silicon chip 152 in FIG. 4.

The three light modulation states are demonstrated in FIG. 5 in which the optic axis of the FLC is shown in each of the three different drive conditions (optic axes 164, 166, and 168). The at least three states include one state 164 of very low output light amplitude or intensity (the OFF state) and two other (ON) states 166 and 168 of high output intensity, at least two of which have different optical phase. This is referred to as ternary modulation, regardless of whether the total number of pixel optical states is three or more than three.

Figure 6:
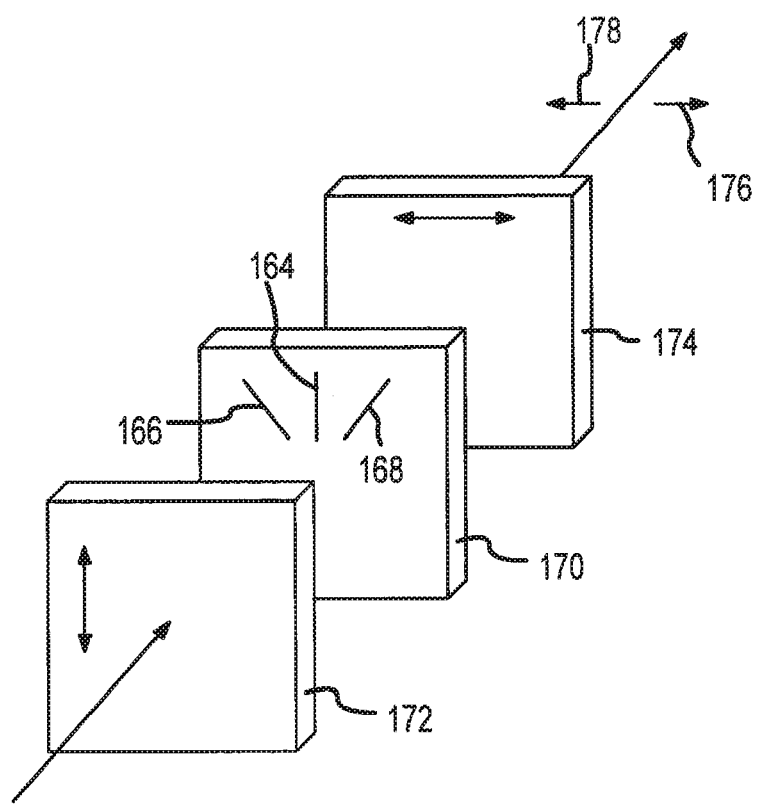
FIG. 6 is a schematic view of a polarizer, 3-state SLM, and analyzer.

This is illustrated more specifically in FIG. 6, in which the switchable FLC film 170 of an SLM pixel is oriented between crossed polarizers (a polarizer 172 and an analyzer 174) so that the FLC optic axis can be switched to either side of the incident light polarization direction. In the example shown here, the two FLC optic-axis orientations are equally disposed on either side of the incident polarization, the output light has the same intensity for each state, but opposite phase (that is, the phase of one output state is +π/2, and that of the other state is $-\pi/2$). The intensity of these two output states is maximized, as usual, when the SLM's FLC film 170 has half-wave total retardance—i.e. quarter-wave single-pass retardance for a reflective SLM. The output intensity is further maximized if the two FLC optic-axis orientations are fully 45° on either side of the input polarization. A third state of near-zero output intensity (an OFF state) can be obtained from an FLC optic-axis orientation substantially parallel to the incident polarization. Analog variation of FLC optic-axis orientation with applied electrical drive signal is known, for example, in the electroclinic effect, the deformable-helix effect, and in the so-called "V-shaped" switching effect [see, for example, Michael J. O'Callaghan, "Switching dynamics and surface forces in thresholdless "V-shaped" switching ferroelectric liquid crystals," Physical Review E, volume 67, paper 011710 (2003); Michael J. O'Callaghan, Michael Wand, Chris Walker, William Thurmes, and Kundalika More, "High-tilt, high PS, de Vries FLCs for analog electro-optic phase modulation," Ferroelectrics, volume 343, pp. 201-207 (2006); the contents of both of which are incorporated herein by reference]. The three optic-axis states shown in FIG. 5 can then be obtained by applying three different levels of electrical drive to a pixel of an SLM having suitable analog response.

An SLM having at least the three optical states described with reference to FIG. 6 can solve the Fourier-plane DC bright-spot problem in a manner similar to that of more usual planarized relief phase masks described in the '197 patent application. Pixels where it is desired that the output intensity be zero are written with the electrical level that produces the OFF state having the FLC optic axis parallel to the incident polarization. Pixels that are desired to be ON can be written to either of the other two states described with reference to FIG. 11. The choice between the two ON states, the $+\pi$ state or the $-\pi$ state (hereinafter the +ON state and the −ON states, respectively), can be made in exactly the same way as the prescription for the design of a fixed phase mask.

Figure 7:
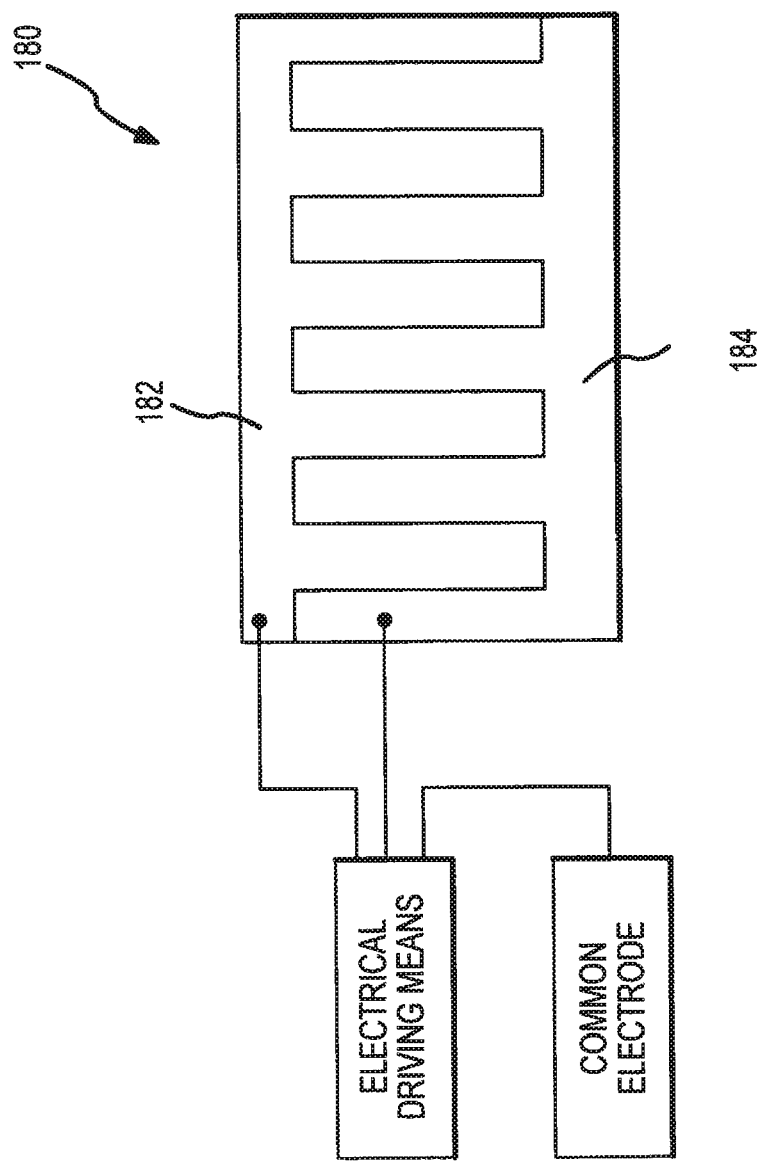
FIG. 7 is a schematic of a pixel utilizing a diffractive structure to achieve ternary modulation.

Another way to implement a three-state switching of the SLM described above is also disclosed in the '197 patent application as shown in FIG. 7. As has been previously disclosed in U.S. Patent Nos. 5,182,665 and 5,552,916, the contents of which are incorporated herein by reference, switchable diffraction can be produced in conventional binary FLC devices, and used to modulate light. In fact, it can be used, as disclosed in the '197 patent application, to produce combined phase and amplitude modulation in a way that allows such an SLM to function to reduce the Fourier-plane DC bright-spot problem in a way exactly analogous to that of those with relief-type phase masks. Each pixel electrode 180 is divided into two interleaved segments, a segment 182 and a segment 184, as shown in FIG. 7, each segment having width q/2. For two signs of applied electrical drive, each pixel then has four states, as enumerated below.

| SEGMENT A | SEGMENT B | PIXEL STATE |
| --- | --- | --- |
| + | + | +ON |
| − | − | −ON |
| + | − | OFF |
| − | + | OFF |

The first two columns of the table above show the polarity of the electrical drive applied by the segment electrodes to the overlying FLC. When positive drive voltage is applied to both segments, their FLC orientations are parallel, both lying on the same side of the incident polarization direction, producing the same +ON state as described above with respect to analog FLC modulators. When negative drive voltage is applied to both electrode segments, their FLC orientations are again parallel, but now both on the other side of the incident polarization direction, producing the same −ON state as described above for the analog FLC modulators. When voltages of opposite polarities are applied to the two segments, the associated FLC material is switched to have opposite optic axis directions, and a "grating" is produced. This grating will diffract at least part of the incident light, at angles that are larger than or equal to $\beta$, where $\sin\beta \sim \lambda/q$ according to the abovementioned U.S. Pat. Nos. 5,182,665 and 5,552,916. In a typical holographic data storage system recorded data density is maximized by inserting a spatial filter into the optical system that removes light diffracted from the SLM pixel array into orders higher than the zero order. In the case is of the sub-pixel gratings shown in FIG. 7, such a spatial filter would essentially stop the light diffracted by the pixel grating state, thereby producing a dark OFF-state image for pixels so driven.

Thus, the '197 patent application disclosed two embodiments where the phase pattern was produced by the electrical drive to the SLM pixel. In a first embodiment case, described in the '197 application with reference to the present FIGS. 3 and 4, a liquid crystal optic axis could be driven to three orientations, one of which caused the pixel to be OFF, while each of the other two optic axis states caused the pixel to be ON, but with a phase difference of $\pi$ from one ON orientation to the other. In a second embodiment, described with reference to the present FIG. 7, a pixel has an electrically switchable diffraction grating, with two OFF states that diffract light out of the aperture of the HDS optical system, and two ON states with a $\pi$ phase difference between them.

Alternatively, it is known to make SLMs that can suitably modulate intensity with selectable phase from nematic liquid crystal devices, typically combined with fixed wave plates, as taught for example by Ju-Seog Jang and Dong-Hak Shin in "Optical representation of binary data based on both intensity and phase modulation with a twisted-nematic liquid-crystal display for holographic digital data storage," published in Optic Letters, Vol. 26, No. 22, pages 1797-1799 Nov. 15, 2001, and also as taught by Judit Reményi, Péter Várhegyi, László Domján, Pál Koppa, and Emõke Lõrincz, in "Amplitude, phase, and hybrid ternary modulation modes of a twisted-nematic liquid-crystal display at ~400 nm," published is in Applied Optics, Vol. 42, No. 17, pages 3428-3434, 10 Jun. 2003. Further relevant teaching may be found in the Ph.D. thesis of László Domján, "Generation of Spatial Light Distributions," Department of Atomic Physics, Faculty of Natural Sciences, Technical University of Budapest, 2004. Each of these publications is incorporated herein by reference.

Further, it is known that magneto-optic SLMs can deliver binary phase states and a zero amplitude state as taught by Brian A. Kast, Michael K. Giles, Scott D. Lindell, and David L. Flannery, in "Implementation of ternary phase amplitude filters using a magnetooptic spatial light modulator," published in Applied Optics, Vol. 28, No. 6, pages 1044-1046, 15 Mar. 1989, which is also incorporated herein by reference. In this case, a magneto-optic film exhibits domains that, through the Faraday effect, rotate the polarization of incident light. Two types of domains exist, one that rotates polarization clockwise, and another that rotates light counterclockwise. Normally, SLM pixels are switched until a single domain has grown to cover the entire extent of the pixel. However, to achieve ternary modulation, Kast et al. partially switched a pixel desired to be OFF, producing a mixed state with the two types of domains randomly distributed throughout the pixel area. With an analyzer crossed to the polarization of an incident beam, the two types of completely switched pixels will both be ON, but have opposite phase. A mixed pixel can be made to be OFF by following the SLM with a spatial filter which rejects the light from the high spatial frequency mixed-domain pattern.

It is also feasible that the same effects could be produced by a micro-mechanical (MEMS) SLM. For example, it is well known in the art to produce an SLM with intensity modulation in the form of an array of tiltable micro-mirrors as is used by the Texas Instruments DLP products. It is known in the art that an SLM with phase modulation can be produced by an array of mirrors that move in piston fashion. An SLM capable of both is intensity and phase modulation as desired to produce the temporally variable phase masks according to the present invention could be fabricated by first producing an array of MEMS piston-motion structures, and the fabricating on top of each piston a tiltable mirror. Thus, the ON/OFF intensity pattern desired to record the user data would be produced by electrically driving the tiltable mirrors to selectably deflect light out of the system aperture, while a superimposed phase pattern could be produced by the driving the piston structures up or down, desirably to produce a total path length variation of 0 to $\pi$. Such MEMS structures with independent control of mirror height and tilt are disclosed by Kebin Li, Uma Krishnamoorthy, Jonathan P. Heritage, and Olav Solgaard in "Coherent micromirror arrays," published in Optics Letters, Vol. 27, No. 5, pages 366-368, Mar. 1, 2002, which is also incorporated herein by reference.

It is also known to use MEMs devices to produce SLMs with selectable phase and amplitude modulation by forming "macropixels" from a plurality of separately switchable MEMS sub-elements, as disclosed in U.S. Pat. No. 5,312,513 (the '513 patent), which is also incorporated herein by reference. For example, with reference to FIG. 3 therein is taught a macropixel composed of four phase-modulating elements. Each of the four sub-elements has the same area, and each can be switched between two phase states A and B that differ by $\pi$; two sub-elements can be selectably switched between a phase state of 0 or $\pi$—the other two sub-elements can be switched between a phase state of $\pi/2$ or $3\pi/2$; the A and B states available to each sub-element are listed in the table below.

| SUB-ELEMENT | STATE A | STATE B |
|---|---|---|
| 1 | 0 | $\pi$ |
| 2 | 0 | $\pi$ |
| 3 | $\pi/2$ | $3\pi/2$ |
| 4 | $\pi/2$ | $3\pi/2$ |

It is further taught therein that if the optical system resolution is set to mix the response of the sub-elements into a single response, different phase and amplitude modulations levels can be achieved. The system resolution limitation needed to produce response mixing could be produced, for example, by introducing a spatial filter that would pass spatial frequencies high enough to allow the macropixel to be resolved but would cut off the higher spatial frequencies needed to resolve the sub-elements. In the case described with reference to FIG. 3 in U.S. Pat. No. 5,312,513, a zero amplitude state is produced when the sub-elements of the first pair (sub-elements 1 and 2 in the table above) are switched opposite of each other and when the sub-elements of the second pair (sub-elements 3 and 4) are also switched opposite of each other; that is when sub-element 1 is in its A state, sub-element 2 is in its B state, sub-element 3 is in its A state and sub-element 4 is in its B state. This and three other zero-amplitude states are listed in the table below:

| | ZERO-AMPLITUDE STATES | | | |
|---|---|---|---|---|
| SUB-ELEMENT | 1 | 2 | 3 | 4 |
| 1 | 0 | $\pi$ | 0 | $\pi$ |
| 2 | $\pi$ | 0 | $\pi$ | 0 |
| 3 | $\pi/2$ | $\pi/2$ | $3\pi/2$ | $3\pi/2$ |
| 4 | $3\pi/2$ | $3\pi/2$ | $\pi/2$ | $\pi/2$ |

As can be seen from this table or from FIG. 4 in the '513 patent, zero amplitude is achieved by setting equal-area pairs of MEMS phase-modulating sub-elements to states where members of a pair differ in phase by $\pi$.

The macropixel described with reference to FIGS. 3 and 4 in the '513 patent can also produce a variety of states with non-zero amplitude, including non-zero amplitude states that differ in combined phase by $\pi$. Four such states all in this case having amplitude equal to 0.707 are listed in the table below.

| | NON-ZERO AMPLITUDE STATES | | | |
|---|---|---|---|---|
| SUB-ELEMENT | 5 | 6 | 7 | 8 |
| 1 | 0 | $\pi$ | $\pi$ | 0 |
| 2 | 0 | $\pi$ | $\pi$ | 0 |
| 3 | $3\pi/2$ | $\pi/2$ | $3\pi/2$ | $\pi/2$ |
| 4 | $3\pi/2$ | $\pi/2$ | $3\pi/2$ | $\pi/2$ |
| COMBINED PHASE | $7\pi/4$ | $3\pi/4$ | $5\pi/4$ | $\pi/4$ |
| COMBINED AMPLITUDE | 0.707 | 0.707 | 0.707 | 0.707 |

States 5 and 6 differ in phase by x, as do states 7 and 8. Thus, the desired ternary modulation could be achieved by choosing any of states 1, 2, 3, or 4 for the OFF state, choosing state 5 for the +ON state and state 6 for the –ON state. Alternately, states 7 and 8 could be chosen for the +ON and –ON states. The same principles can be applied to other MEMs devices where macropixels are formed from sub-elements, such as the Grating Light Valve disclosed in U.S. Pat. No. 7,057,795: in an optical system of resolution limited so that a pixel is resolved but its sub-elements are not an OFF state is produced by pairs of sub-elements of equal area switched so the members of the pair differ in phase by $\pi$, while + and –ON states are produced by setting the sub-elements so the members of the pair do not differ in phase.

Figure 8:
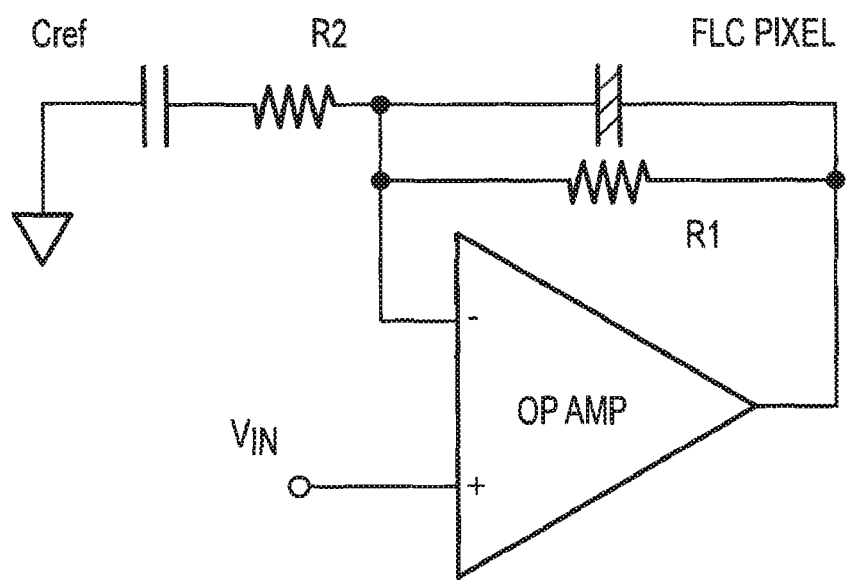
FIG. 8 is an FLC analog charge-control drive circuit.
Figure 15:
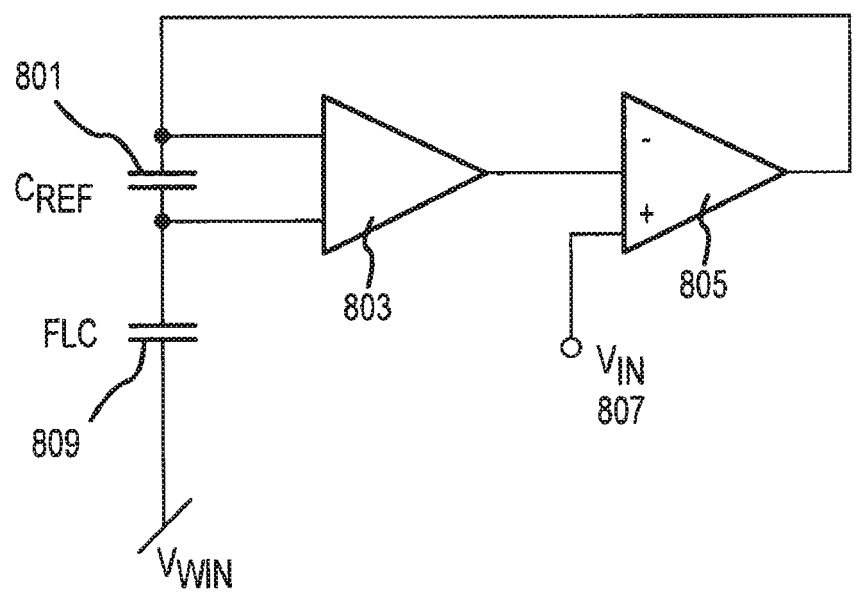
FIG. 15 shows a drive circuit for an LCOS device in a ternary SLM.

The two ternary FLC SLMs described in the '179 patent application, an analog-responding FLC SLM and a diffractive FLC SLM, can be further improved for use in the present invention. In the case of the analog SLM, the SLM analog drive circuitry deserves further consideration. It is taught in the two O'Callaghan references mentioned above that superior control over the FLC analog response can be achieved using charge control drive. A charge-control drive circuit of the type used in these references is shown here in FIG. 8. The FLC element, portrayed here as a capacitor, provides the negative feedback around an operational amplifier. An input voltage $V_{in}$ causes a charge $Q=V_{in}C_{ref}$ to appear across the FLC element. To make a ternary SLM employing analog FLC modulators, an LCOS device could be made with each pixel containing a drive circuit similar to that shown in FIG. 8, is suitably modified to allow one terminal of each FLC pixel to connect to a common electrode (ITO glass window) not accessible to the individual pixel driver, as shown in FIG. 15, which measures the voltage across a reference capacitor 801 using a difference amplifier 803, and then applies negative feedback using amplifier 805 to make the reference-capacitor voltage equal to an input voltage 807, thus ensuring again that the FLC element 809 is driven with a charge $Q=V_{in}C_{ref}$.

Simpler pixel drive circuits could be made using current sources derived from current mirrors, as is know in the art. To drive the FLC pixel with a desired amount of charge it is simply required to connect a current source of known strength to the FLC pixel for an amount of time needed for the source to supply the desired charge. For the ternary FLC pixels desired here as part of an SLM with changeable phase mask, the two ON states could be achieved by conventional voltage drive (with the pixel electrode being driven to one or the other power supply rail depending on an input bit indicating whether the pixel state should be + or −ON), with the current source being used only to provide the charge needed to drive the FLC to the OFF state.

Alternately, charge-control drive for analog ternary FLC pixels can be provided without recourse to any analog drive circuitry. The reversal of the FLC's ferroelectric polarization provides a predictable current sink in response to a drive-voltage switching edge. To drive an FLC pixel to the OFF state at the center of its range between the two extreme ON states it is only necessary to open-circuit the pixel electrode at the switching half-way point. This can be accomplished in a conventional pixel driver by inserting a CMOS transmission gate between the voltage drive and the pixel electrode. Then, in the case where it is desired to switch the pixel from one ON state to the other, the transmission gate can be left closed, is whereas when it is desired to switch from one ON state to the OFF state, the transmission gate can be opened at the half-way point according to a globally distributed timing signal. Whether the gate opens or not can be controlled by a single bit stored in the pixel (the bit indicating OFF). This disadvantage of this technique is that it relies on the uniformity of the response dynamics of all the pixels across the SLM. Small variations in SLM manufacturing may produce non-uniformities. For example, the liquid-crystal gap may be thicker at the center of the SLM and thinner at its periphery. In this case, pixels in the center may switch slower than pixels at the edge. In the referenced U.S. provisional patent application 60/883, 492 is described means for controlling the timing of pixel switching events with a very high degree of precision while maintaining a very compact pixel layout. This technique could easily be adapted for the present purposes by using the TRIGGER signal to control the state of a pixel transmission gate rather than the state of the voltage drive. Then, in addition to data representing the input data, compensating values could also be stored in the pixel, to provide correct timing for achieving a high-contrast OFF state. The compensating data could derived by characterizing the response of an individual SLM, on a pixel-by-pixel basis, if necessary.

The diffractive ternary SLM described in the '170 patent application as shown here in FIG. 7 needs only a single metal layer to provide electrical connection to the two interdigitated electrodes. Alternately, the structure in FIG. 9 could produce a higher-contrast OFF state. In the structure shown in FIG. 9, the pixel electrode is divided into six stripes or sub-elements. The stripes are connected to two underlying drive terminals by vias, indicated here by black dots. Three of the stripes are connected to a first drive terminal, and the other three stripes are connected to a separate drive terminal. The drive terminals can be driven as described above with reference to FIG. 7; however, by extending the stripe structures almost all the way to the edge of the pixel (the edge indicated here by the dashed line) the diffraction properties are improved.

Figure 10:
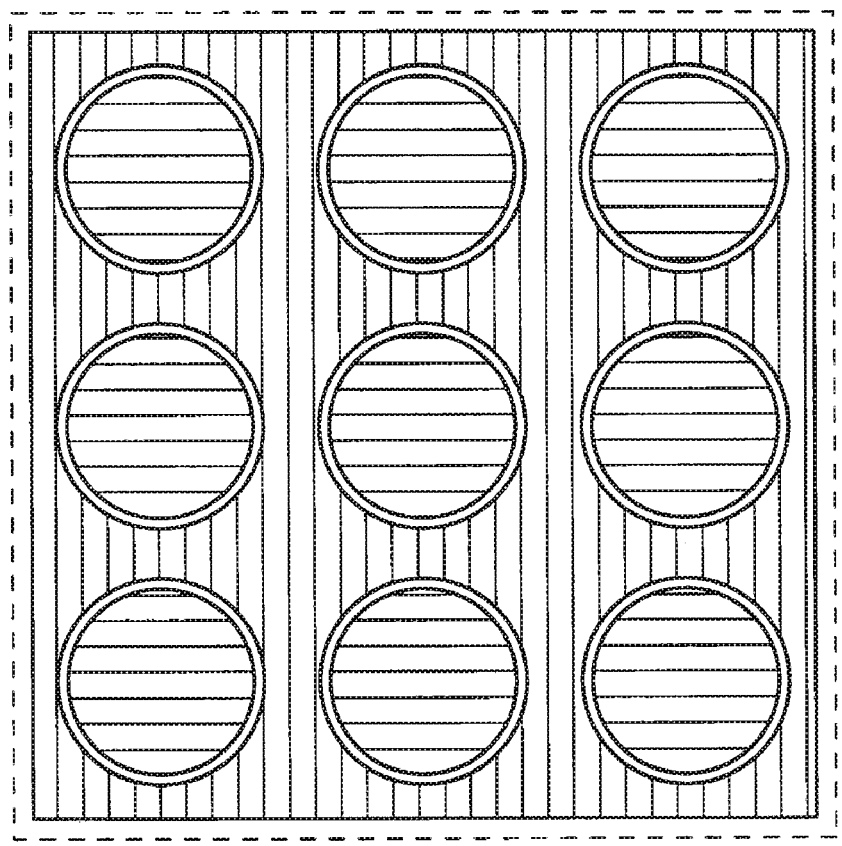
FIG. 10 is a view of a pixel electrode structure for a diffractive ternary FLC SLM.

It is also known to make diffractive pixels with sub-elements having shapes other than stripes, as disclosed in U.S. Pat. No. 7,064,883. Although the modulators disclosed in the patent are MEMS-based, the same principles can be applied to FLC modulators, as described now with reference to FIG. 10, which shows the electrode for a single pixel out of an array of similar or identical pixels. The pixel electrode is divided into two separately switchable sub-elements, one a perforated square (with vertical shading lines in FIG. 10) and the other nine circles electrically connected together (with horizontal shading lines in FIG. 10). These two sub-elements can again be driven as described above with reference to FIG. 7 to produce + and −ON states differing by $\pi$ in optical phase, and two OFF states resulting from spatial low-pass filtering in the optical system rejecting the light diffracted by the differently-switched sub-elements. Best performance is achieved when the electrode area of the two sub-elements is equal, that is when the vertically-shaded region in FIG. 10 has an area equal to the horizontally-shaded region. Shapes other than squares and circles can be used, as disclosed in the '883 patent. The pixel shown in FIG. 10 uses a 3×3 array of one shape within a square pixel. Alternately, a 4×4 array or a 5×5 array or even a 2×2 array could be used. As the number of elements in the array is increased, the diffracted light produced in the OFF state is diffracted to higher and higher angles which is generally desired for producing higher contrast between the ON and OFF states. However, given the necessity for an insulating gap separating the two electrode regions (shown as the white, un-shaded regions surrounding the circles in FIG. 10) of a least some minimum dimension, the reflective fill factor of the overall pixel electrode decreases as the number of shapes in the array is increased. Thus, contrast and throughput can be traded off to optimize performance given the requirements of a particular system by changing the number of shapes used to form the pixel sub-elements. It is even possible to use a sub-element composed of a single shape to make a ternary pixel if only modest contrast were required.

Figure 9:
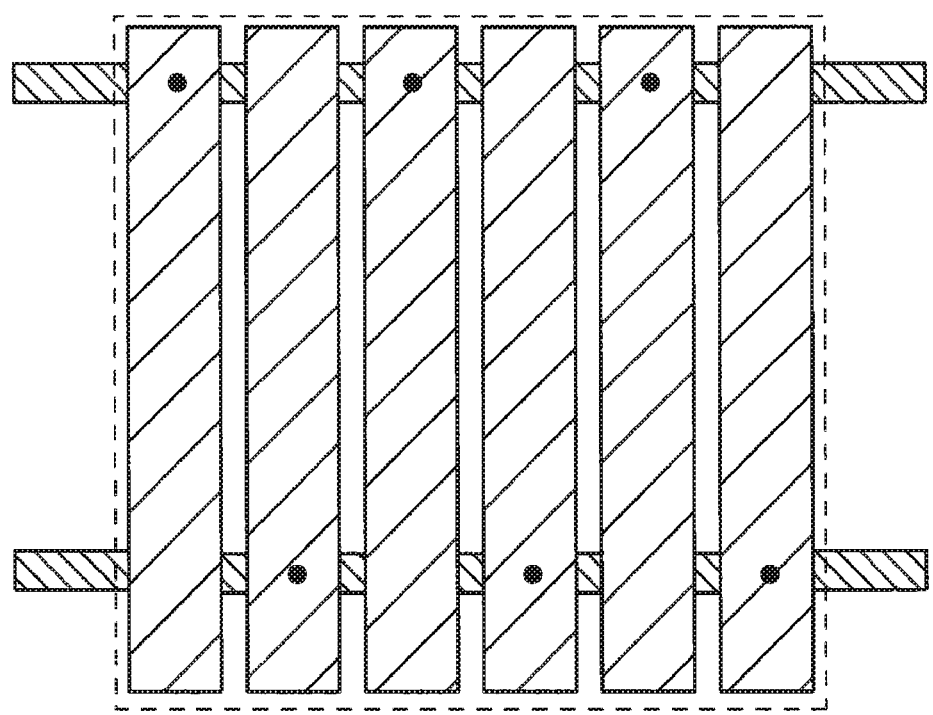
FIG. 9 shows an improved electrode arrangement for a diffractive ternary FLC SLM.

Similarly, for the stripe-element ternary pixel described with reference to FIG. 9, the number of stripe pairs can be varied from three as shown, to four, five, two, or even one. The fill factor and throughput efficiency are improved by narrowing the insulating gap between electrode regions as far as possible. For example, LCOS CMOS processes can produce gaps as small as 0.5 µm or even 0.3 µm. In the case of a ternary pixel with n stripe pairs, pixel pitch p and inter-electrode gap g, the fill factor is given by $\{1-(g/p)[(4n^2+1)/(2n)-g/p)]\}$. For an SLM with pixel pitch p=10 µm, g/p=0.05 for 0.5 µm gaps. For three pairs of stripes, the fill factor is 69%, which would improve to 82% with 0.3 µm gaps. Even at a pixel pitch of p=6 µm, a fill factor of 79% can be achieved with 0.3 µm gaps and two stripe pairs.

Figure 11:
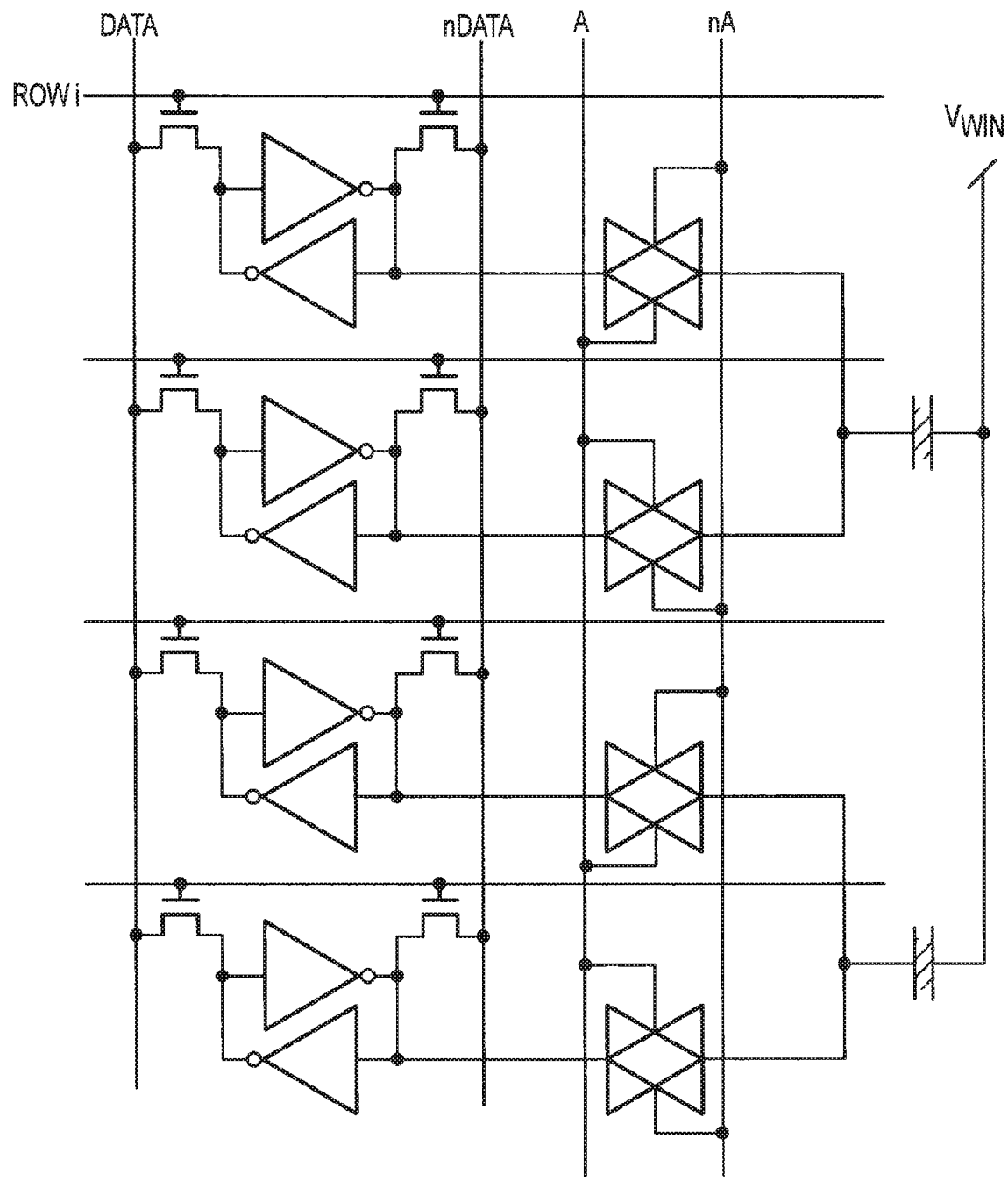
FIG. 11 shows a pixel circuit for driving a diffractive ternary FLC SLM pixel.
Figure 12:
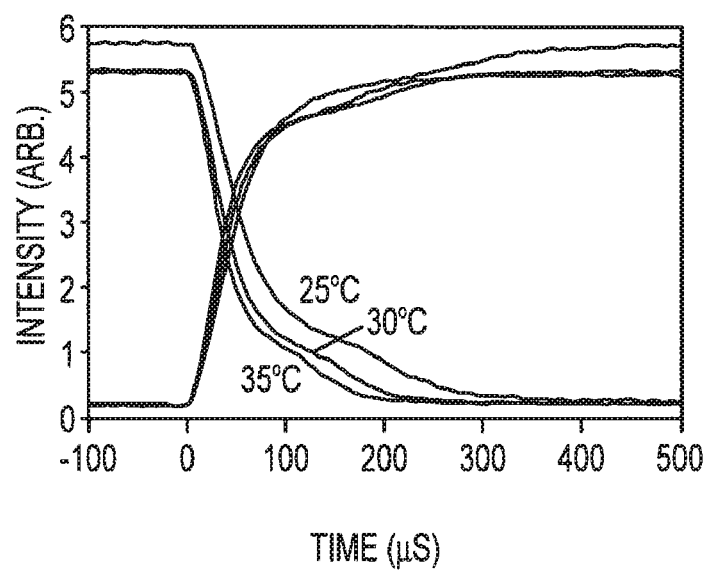
FIG. 12 shows FLC optical response times at various temperatures when driven with ±1.65 V electrical drive.

The diffractive ternary FLC pixels, whether with stripe sub-elements or other shapes, can be driven with a CMOS pixel circuit like that shown in FIG. 11. It comprises four standard cross-coupled inverter static latches and four transmission gates. Each sub-element electrode can be connected to one of two latches according to the state of the transmission gates. When line A is high (and line nA is low), the each sub-element is connected to the top one of the respective latches, while when line A is low (and line nA is high), the sub-element is connected to the bottom one of the respective latches. While the FLC modulators are displaying the data associated with the top latch in each pair, the state of the bottom latch can be changed by asserting new data on the DATA and nDATA lines while activating the appropriate row electrodes. Then, the state of the A lines can be changed to display the newly written data while the data in top latch in each pair can be changed in a similar fashion. Given six transistors in each static latch and four in each transmission gate, this pixel circuit comprises 40 transistors. Applicant has observed that silicon foundries offer static-latch standard cells that occupy an area of approximately 130 f$^2$, where f is the process feature size or node. Allowing an area for the transmission gate similar to that for the latch, this pixel circuit could be laid out in an area of about 1040 f$^2$. For a CMOS process with f=0.18 μm, this would require an area of 33.7 μm$^2$, or a square about 6 μm on a side. Those skilled in the electronic and VLSI arts will appreciate that simpler circuits with the same functionality as that shown in FIG. 11 are possible, enabling still smaller layouts. It is a virtue of FLC modulators that they provide fast optical response time with relatively low drive voltages. For example, applicant has measured the FLC optical response curves shown in FIG. 12. Optical response that essentially saturates in 200 μs can be obtained in this example with drive of ±1.65 V, as could be provided by CMOS drivers putting out 0 V or 3.3 V, with the common electrode held at V$_{WIN}$=1.65 V. Faster FLC materials with response times of 100 μs or even 50 μs can be engineered by suitable choice of molecular constituents and operating temperature, even with drive voltages constrained to CMOS logic levels such as 5 V or 3.3 V. The circuit of FIG. 11 enables providing new data to the pixel during the FLC optical response time, so a new optically-valid state can be obtained every 200 μs, or even every 100 μs, or every 50 μs. These response speeds are considerably faster than can easily be obtained with nematic liquid crystals like those disclosed by Reményi et al. or by Jang and Shin. Further the operating voltages are lower than those usually found for MEMS pixels, such as the 10-14 V usually required to operate devices like the Grating Light Valve, or even the ±26 V conventionally used to operate the Texas Instruments DLP tilting mirrors. Lower drive voltages favor reduced operating power and smaller pixel layouts and pixel pitches. FLC LCOS SLM power is overall much lower than that associated with the high currents needed to drive known magneto-optic SLMs. Furthermore, FLC SLMs can be designed to operate over a wide range wavelengths including blue light with wavelength as short at 400 nm, which is difficult for magneto-optic SLMs because of the short-wavelength absorption of the garnet materials on which they are based.

Figure 13:
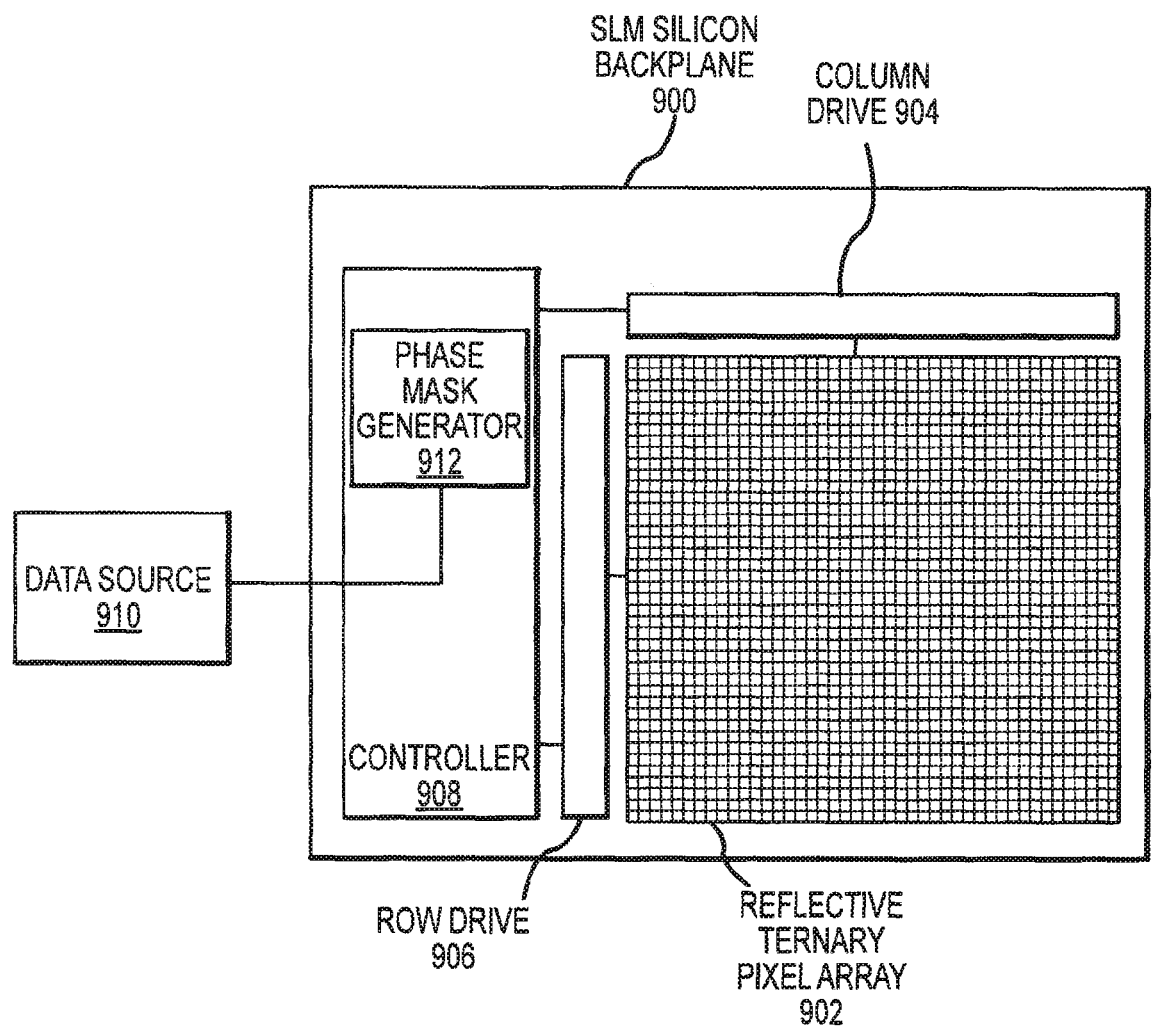
FIG. 13 shows a system for producing a data pattern on an SLM.
Figure 14:
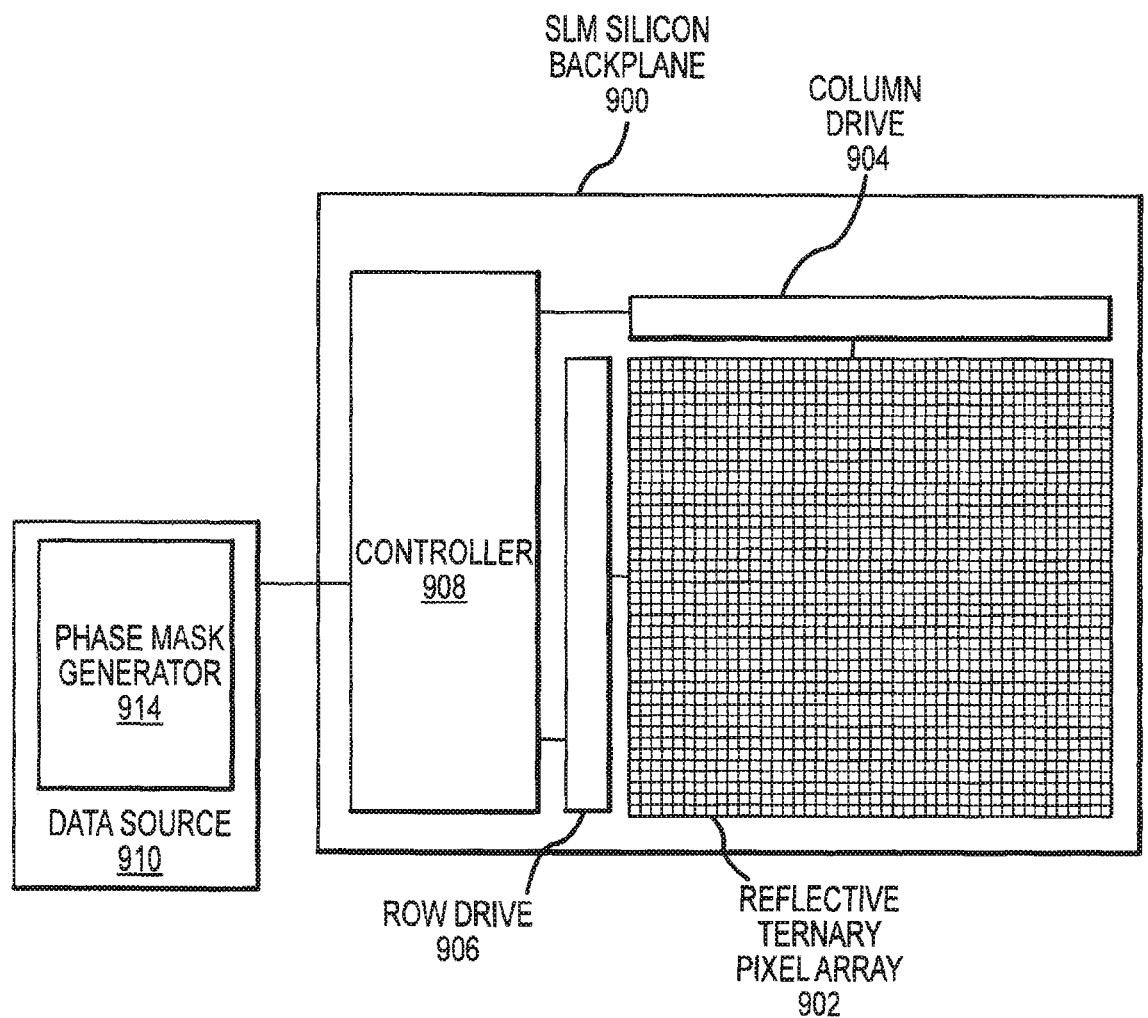
FIG. 14 shows another system for producing a data pattern on an SLM.

FIGS. 13 and 14 show two embodiments of systems for producing data patterns on SLMs, which patterns have superimposed phase-mask patterns that are changeable. In the system shown in FIG. 13, the SLM accepts data from an external source 910, such as the channel electronics in a data storage drive. The SLM comprises an array of ternary modulators as described above. The SLM is preferably implemented as a silicon backplane, with reflective liquid-crystal or MEMS modulators, or more preferably FLC modulators. The state of the ternary pixels is controlled by row drive electronics 906 and column drive electronics 904. The overall SLM is controlled by a controller 908. The controller 908 accepts data from the external source 910; the controller includes a phase-mask generator 912. In response to the sequence of 0's and 1's provided from the external source, and in response to internally executed algorithms, the phase mask controller 908 determines for the pixels that are destined to be turned ON by an input 1, which ones will be set to a +ON state and which ones will be set to a −ON state.

For example, the phase values for the pixels of an SLM with integrated phase mask produced using ternary modulators could be assigned at random. Alternatively, the phase values could be generated by, for example, a pseudo-random number generator in phase-mask generator 912, electronic implementations of which are well known in the art. The table below shows an example of 16 input data bits: a sequence of 0's and 1's of data that a is user wishes to store in the HDS system.

|  | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| input data | 0 | 1 | 0 | 0 | 1 | 0 | 1 | 1 | 1 | 0 | 0 | 1 | 1 | 1 | 1 | 1 |
| input phase | x | 0 | x | x | π | x | 0 | π | π | x | x | π | 0 | 0 | 0 | π |

When the user data bit is a 1, which will result in a bright SLM pixel, it is accompanied by a phase value of 0 or π, produced by a pseudo-random number generator which is part of phase-mask generator 912 (i.e. the phase value need not be provided by the user). When the user data bit is a 0 which will result in a dark OFF SLM pixel, the phase value provided by the pseudo-random generator can be ignored, as denoted by "x". Using a different phase-mask control algorithm, the phase values could be assigned in alternation, as shown in the table below.

|  | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| input data | 0 | 1 | 0 | 0 | 1 | 0 | 1 | 1 | 1 | 0 | 0 | 1 | 1 | 1 | 1 | 1 |
| input phase | x | 0 | x | x | π | x | 0 | π | 0 | x | x | π | 0 | π | 0 | π |

As an alternative to the pseudo-random generation of phase patterns, a number of fixed patterns could be provided to the SLM, with the fixed pattern being changed from time to time, or even changed every exposure. In this case the SLM cycles through the sequence of patterns. To provide greater diversity of intensity spike patterns in the recording media with a smaller set of fixed phase patterns, the phase patterns could be shifted on the SLM. For example, a given phase pattern could be shifted a chosen number of columns to the left across the SLM on every exposure or at some other desired interval.

Alternatively, the phase pattern could be shifted down one row of pixels and back the next, or really in any other desired manner.

To reduce the bandwidth required of the SLM data input bus, a preferred embodiment incorporates the pseudo-random number generator into the integrated circuitry of the phase mask generator 912 which is included on the SLM backplane. Alternatively, in the case where predetermined phase patterns are desired, a pattern generation engine could be provided within the phase-mask generator 912 on the SLM backplane. The pattern-generation engine could generate phase patterns according to input "seeds" provided by other elements of the HDS system. Alternatively, predetermined phase patterns could be input to the phase-mask generator and stored in digital memory incorporated into the phase-mask generator 912. These internal memory registers could be read out onto the pixels to determine the phase value a given pixel would display at a given time. In the case where it is desired to shift the pattern from time to time, circuitry for reading out a single pattern from the SLM internal memory and writing with a programmable shift value onto the SLM pixels could also be provided.

In another embodiment, the phase values are not chosen at random. The intensity spikes or peaks illustrated in FIG. 2 arise from patterns of phase values in the phase mask that are described by a small range of spatial frequencies. If the spatial frequencies of the phase mask were more evenly distributed the height of the spikes or peaks would be reduced. It is possible to design phase masks using suitable computational algorithms so that the spatial frequency spectrum is in fact more even. However, in an SLM with a fixed phase mask, many of the phase elements will be obscured by OFF pixels at locations that can not be predetermined since they arise from the arbitrary user data pattern. However, a modified algorithm could compute the phase values in response to a given data pattern prior to its exposure. The algorithm could adjust the phase values assigned to pixels having user data value of 1 (ON pixels) in a way responsive to the spatial locations of those ON pixels so as to evenly distribute the spatial frequency components of the phase pattern and thereby reduce the heights of the intensity spikes in the HDS recording media. This algorithm could be executed by phase-mask generator 912 in response to the input data pattern.

As an alternative to including the phase-mask generator within the SLM backplane as depicted in FIG. 13, an external phase mask generator 914 could be made part of the source 910, as depicted in FIG. 14, that provides the data to be stored in the holographic medium. This would facilitate cooperation of the phase-mask controller with the channel electronics, including any data coding schemes (perhaps iterative) being executed by the channel electronics. The price to be paid is that now the amount of input information provided to the SLM will average more than 1 bit per SLM pixel, creating a need to somewhat increase the input bandwidth of the SLM.

Similarly, any light modulating pixel capable of both intensity or amplitude modulation combined with phase modulation could be used in accordance with the techniques described herein.

The foregoing description has been presented for purposes of illustration and description. Furthermore, the description is not intended to limit the invention to the form disclosed herein. While a number of exemplary aspects and embodiments have been discussed above, those of skill in the art will recognize certain variations, modifications, permutations, additions, and sub-combinations thereof. It is therefore intended that the following appended claims and claims hereafter introduced are interpreted to include all such variations, modifications, permutations, additions, and sub-combinations as are within their true spirit and scope.

What is claimed is:

1. A write head for a holographic data storage system, the write head comprising:
    a spatial light modulator that is arranged into an array of pixels that can each separately modulate light that is directed toward the spatial light modulator; and
    a phase mask that is capable of varying the phase of light passing therethrough and directed toward the spatial light modulator, the phase variation being dependent on a particular portion of the phase mask that the light passes through, wherein the phase variation of at least a portion of the phase mask can be changed over time.

2. A write head as defined in claim 1, wherein the pixels of the spatial light modulator can be switched into one of at least three different optical states.

3. A write head as defined in claim 1, wherein the spatial light modulator is a liquid crystal spatial light modulator.

4. A write head as defined in claim 3, wherein the spatial light modulator is a ferroelectric liquid crystal spatial light modulator.

5. A write head as defined in claim 3, wherein the spatial light modulator includes a layer of liquid crystal material sandwiched between two substantially planar surfaces.

6. A write head as defined in claim 1, wherein the spatial light modulator includes micromechanical mirrors that can be moved over time.

7. A write head as defined in claim 6, wherein each of the micromechanical mirrors is tilted to at least one of two different positions to turn the pixel associated with that mirror ON or OFF and each of the micromechanical mirrors is moved in a direction substantially parallel to the incoming light to at least one of two different positions to change the phase of the pixel associated with that mirror.

8. A write head as defined in claim 1, wherein each pixel in the array of pixels of the spatial light modulator includes a pixel electrode and each pixel electrode includes at least two segments, wherein the two segments can be driven to different voltage levels relative to each other.

9. A write head as defined in claim 8, wherein the two segments include interleaved portions that can create a diffraction grating.

10. A write head as defined in claim 1, wherein the phase variation is changed in a random fashion.

11. A write head as defined in claim 1, wherein the phase variation is changed in a pseudo-random fashion.

12. A write head as defined in claim 1, wherein the phase variation is changed in a predetermined fashion.

13. A write head as defined in claim 12, wherein the pixels of the spatial light modulator have an amplitude optical state determined by data supplied thereto, wherein the predetermined fashion is determined in accordance with the supplied data.

14. A write head as defined in claim 13, wherein the amplitude optical state includes at least two different amplitude optical states, one of which has a very low amplitude and one which has a relatively higher amplitude, wherein for the higher amplitude optical state, the phase variation is of a first amount for a given pixel, and for the next subsequent pixel that is in that same amplitude optical state, the phase variation is of a second amount, with the phase variation continuing to alternate between the first and second amounts for subsequent pixels.

15. A write head as defined in claim 1, wherein the array of pixels in the spatial light modulator has a pixel pitch of less than 6 μm.

16. A write head as defined in claim 1, wherein the phase variation is determined by a phase mask generator that is located in a silicon backplane with the spatial light modulator.

17. A write head for a holographic data storage system, the write head comprising a spatial light modulator having an array of pixels, each of the pixels in the array being independently switchable between a high optical throughput state and a low optical throughput state in response to data supplied thereto, each of the pixels in the high optical throughput state further being switchable between a first optical phase state and a second optical phase state in a predetermined fashion in accordance with the supplied data.

18. A write head as defined in claim 17, wherein each pixel includes a switchable diffractive structure switchable between a first state of greater diffraction and a second state of lesser diffraction.

19. A write head as defined in claim 18, wherein the high optical throughput state corresponds to the second state of lesser diffraction while the low optical throughput state corresponds to the first state of greater diffraction.

20. A write head for a holographic data storage system, the write head comprising:
- a spatial light modulator that is arranged into an array of pixels that can each separately modulate light that is directed toward the spatial light modulator; and
- a phase mask that is capable of varying the phase of light passing therethrough and directed toward the spatial light modulator, the phase variation being dependent on which particular portion of the phase mask that the light passes through, wherein the phase variation of at least a portion of the phase mask can be changed over time.

21. A write head as defined in claim 20, wherein the pixels of the spatial light modulator have an amplitude optical state determined by data supplied thereto, wherein the phase variation is changed in a predetermined fashion that is determined in accordance with the supplied data.

* * * * *